(12) United States Patent
Lenchenkov et al.

(10) Patent No.: US 9,232,162 B2
(45) Date of Patent: Jan. 5, 2016

(54) OPTICAL ISOLATION OF OPTICALLY BLACK PIXELS IN IMAGE SENSORS

(75) Inventors: Victor Lenchenkov, Sunnyvale, CA (US); Robert Daniel McGrath, Pittsford, NY (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 303 days.

(21) Appl. No.: 13/587,210

(22) Filed: Aug. 16, 2012

(65) Prior Publication Data

US 2013/0113968 A1    May 9, 2013

Related U.S. Application Data

(60) Provisional application No. 61/557,343, filed on Nov. 8, 2011.

(51) Int. Cl.
  *H01L 27/146* (2006.01)
  *H04N 5/361* (2011.01)

(52) U.S. Cl.
  CPC ............ *H04N 5/361* (2013.01); *H01L 27/1464* (2013.01); *H01L 27/14623* (2013.01); *H01L 27/1463* (2013.01)

(58) Field of Classification Search
  CPC H04N 5/361; H01L 27/1464; H01L 27/1463; H01L 27/14623
  USPC .................................. 348/243, 302; 257/447
  See application file for complete search history.

(56) References Cited

U.S. PATENT DOCUMENTS

| | | | |
|---|---|---|---|
| 6,168,965 B1 | 1/2001 | Malinovich et al. | |
| 2006/0012838 A1* | 1/2006 | Ovsiannikov | 358/512 |
| 2006/0022231 A1* | 2/2006 | Rhodes et al. | 257/291 |
| 2009/0160983 A1* | 6/2009 | Lenchenkov | 348/294 |
| 2009/0201393 A1 | 8/2009 | Tai et al. | |
| 2011/0101430 A1* | 5/2011 | Lee | 257/292 |
| 2011/0199518 A1 | 8/2011 | Zheng et al. | |

* cited by examiner

*Primary Examiner* — Mekonnen Dagnew
(74) *Attorney, Agent, or Firm* — Treyz Law Group, P.C.; Kendall P. Woodruff

(57) ABSTRACT

Optical isolation is provided for optically black pixels in image sensors. Image sensors, such as backside illumination (BSI) image sensors, may have an active pixel array and an array having optically black pixels. Isolation structures such as a metal wall may be formed in a dielectric stack between an active pixel array and optically black pixels. Patterned shallow trench isolation regions or polysilicon regions may be formed in a substrate between an active pixel array and optically black pixels. An absorption region such as a germanium-doped absorption region may be formed in a substrate between an active pixel array and optically black pixels. Optical isolation and absorption regions may be formed in a ring surrounding an active pixel array.

20 Claims, 6 Drawing Sheets

OPTICAL ISOLATION OF OPTICALLY BLACK PIXELS IN IMAGE SENSORS

This application claims the benefit of provisional patent application No. 61/557,343, filed Nov. 8, 2011, which is hereby incorporated by reference herein in its entirety.

BACKGROUND

This relates generally to imaging devices, and more particularly, image sensors having optically black pixels for backside illumination image sensors.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology.

An image sensor may include an active pixel array having photodiodes. The image sensor may have optically black pixels that provide reference signals for use when processing signals from active pixels in the active pixel array. It is important that optically black pixels are optically isolated so as to receive as little light as possible.

Backside illumination (BSI) image sensors have been developed in which incoming light enters from a back side of a substrate. A dielectric stack, which is beneficial for isolating control and bias metal lines, is provided on a front side of a substrate. In BSI image sensors, incoming light does not pass through such a dielectric stack before reaching photodiodes in the substrate, which can result in improved pixel signals.

However, it may be difficult to provide good optical isolation for optically black pixels in BSI image sensors. Due to the position of the dielectric stack, stray light is sometimes reflected into the optically black pixels.

It would therefore be desirable to be able to provide image sensors having improved optical isolation for optically black pixels in backside illumination image sensors.

DETAILED DESCRIPTION

Digital camera modules are widely used in electronic devices such as digital cameras, computers, cellular telephones, or other electronic devices. These electronic devices may include image sensors that receive incoming light to capture an image. The image sensors may include arrays of image sensor pixels. The pixels in the image sensors may include photosensitive elements such as photodiodes that convert the incoming light into digital data. Image sensors may have any number of pixels (e.g., hundreds or thousands or more). A typical image sensor may, for example, have millions of pixels (e.g., megapixels). In high-end equipment, image sensors with ten megapixels or more are not uncommon.

Figure 1:
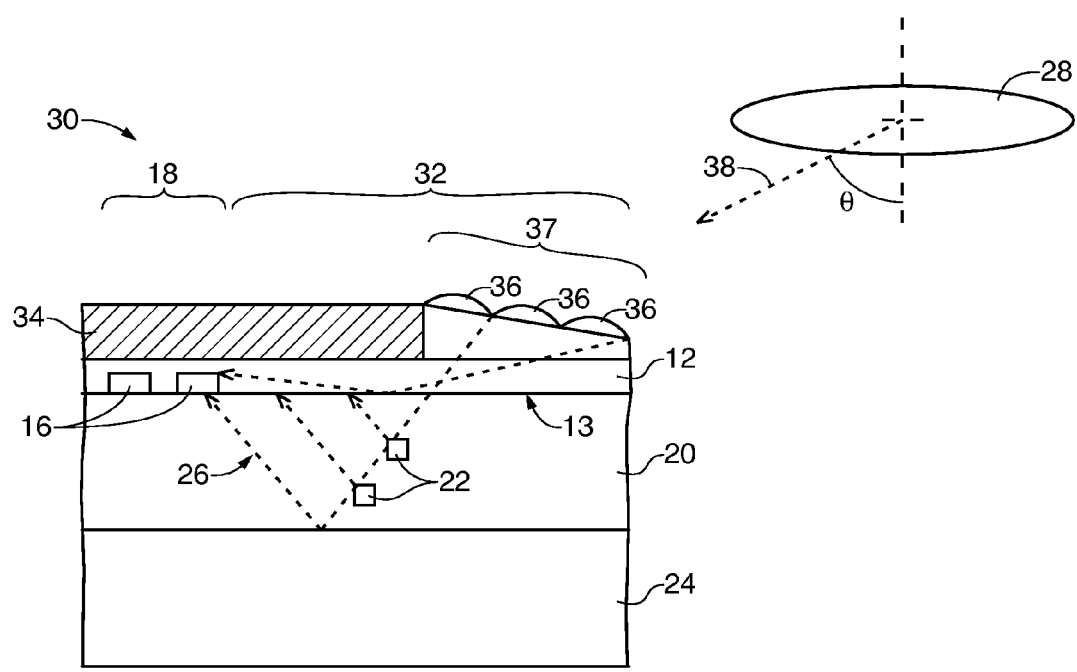
FIG. 1 is cross-sectional side view of optically black pixels in a conventional backside illumination image sensor.

FIG. 1 is a cross-sectional side view of optically black pixels in a conventional backside illumination image sensor 30. Image sensor 30 has a silicon substrate 12. A dielectric stack 20 is formed on front surface 13 of substrate 12. Dielectric stack 20 includes metal interconnect structures 22 formed in dielectric material (e.g., silicon dioxide). A silicon carrier board 24 is formed on dielectric stack 20.

Optically black pixels 16 are located in optically black pixel region 18. Optically black pixels 16 are shielded by shielding structure 34, such as a black color filter array or metal-shielded color filter array.

Optically black pixels 16 are separated from an active pixel array by buffer region 32. Buffer region 32 often has a sloped portion 37 that accommodates metal routings. Sloped portion 37 often has dummy microlenses 36 that are formed during the fabrication of a microlens array on an adjacent active pixel array.

Camera lens 28, shown schematically, focuses light onto image sensor 30. As optically black pixels are often formed at peripheral regions of an image sensor, light 38 reaching optically black pixel region 18 and buffer region 32 typically has a non-zero chief ray angle θ. Such light is often focused by dummy microlenses 36 in such a way that the light could reflect off interfaces between silicon 12 and dielectric stack 20, metal interconnects 22 in dielectric stack 20, and interfaces between dielectric stack 20 and silicon carrier board 24. Such stray light, as indicated by dashed arrows 26 in FIG. 1, could be absorbed by optically black pixels 16.

Optically black pixels 16 are typically used to provide background signals that are subtracted from pixel signals from an active pixel array. Stray light impinging on optically black pixels 16 can result in black pixel signals that are overly large, resulting in an inaccurate background subtraction. Such an inaccurate background subtraction is often referred to as rowbanding for situations in which certain rows in a pixel array are affected. It would be desirable to have improved optical isolation for optical black pixels 16.

FIG. 2 is a diagram of an illustrative image sensor 40. Image sensor 40 may have a pixel array 42. Pixel array 42 may also be known as an active pixel array. Pixel array 42 may have pixels arranged in rows and columns. Pixel array 42 may have hundreds, thousands, millions, or more, pixels. Pixels in pixel array 42 may output pixel signals.

Optically black pixel array 46 may be provided at a periphery of pixel array 42. Optically black pixel array 46 may have optically black pixels in rows and columns. Optically black pixel array 46 has a width W1. Optically black pixel array 46 may have less than 5 pixels, 5-10 pixels, less than 50 pixels, 10 to 50 pixels, 5 to 100 pixels, or other suitable numbers of pixels provided along a direction of width W1.

Optically black pixel array 46 may be separated from active pixel array 42 by a buffer region 44. Buffer region 44 may contain no pixels. Buffer region 44 may be known as a dead pixel zone. Buffer region 44 may have a width W2 that is measured in pixels, such as a width W2 that is less than 5 pixels, 5-10 pixels, less than 50 pixels, 10 to 50 pixels, 5 to 100 pixels, or other suitable numbers of pixels.

Figure 2A:
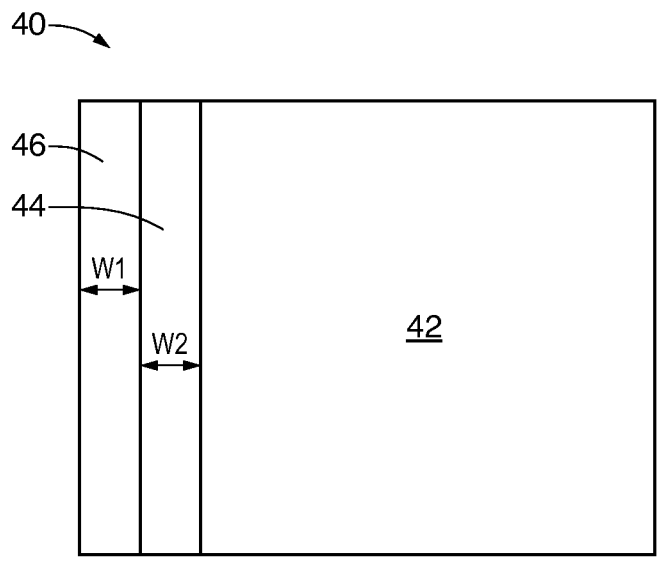
FIG. 2A is a diagram of an illustrative image sensor having an active pixel array and an optically black pixel array in accordance with an embodiment of the present invention.

In the example of FIG. 2A, optically black pixel array 46 is provided at one side of active pixel array 42. If desired, optically black pixel array 46 may be provided at two sides, three sides, or four sides of active pixel array 42.

Figure 2B:
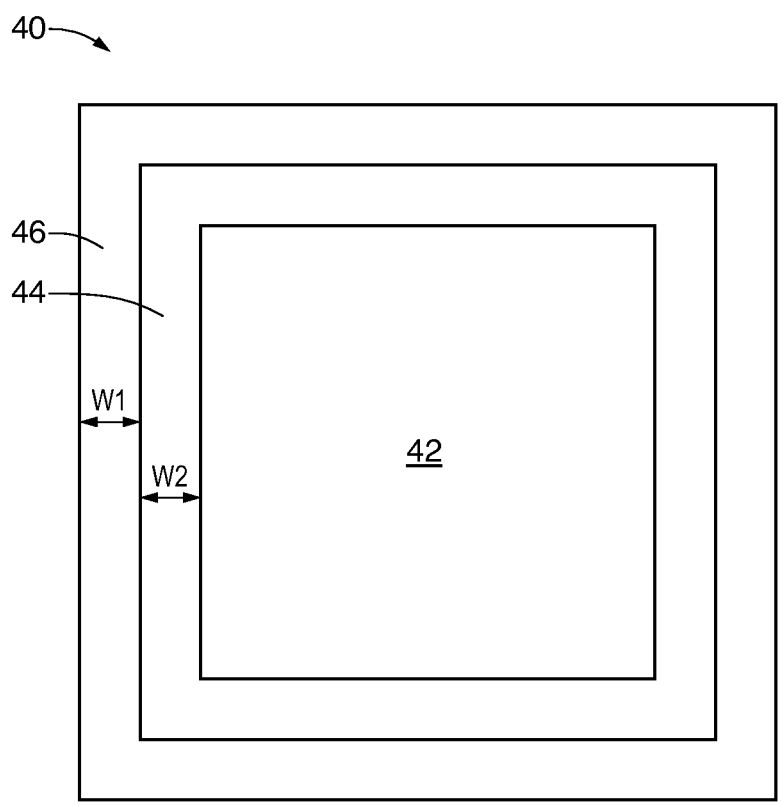
FIG. 2B is a diagram of an illustrative image sensor having an active pixel array and an optically black pixel array surrounding the active pixel array in accordance with an embodiment of the present invention.

FIG. 2B is a diagram of an illustrative image sensor 40 having optically black region 46 surrounding active pixel array 42. Buffer region 44 may be located between optically black region 46 and active pixel array 42. Buffer region 44 may surround active pixel array 42. Optically black pixel array 46 of FIG. 2B may have less than 5 pixels, 5-10 pixels, less than 50 pixels, 10 to 50 pixels, 5 to 100 pixels, or other suitable numbers of pixels provided along a direction of width W1. Buffer region 44 of FIG. 2B may have a width W2 measured in pixels such as, e.g., less than 5 pixels, 5-10 pixels, less than 50 pixels, 10 to 50 pixels, 5 to 100 pixels, or other suitable numbers of pixels.

Figure 3:
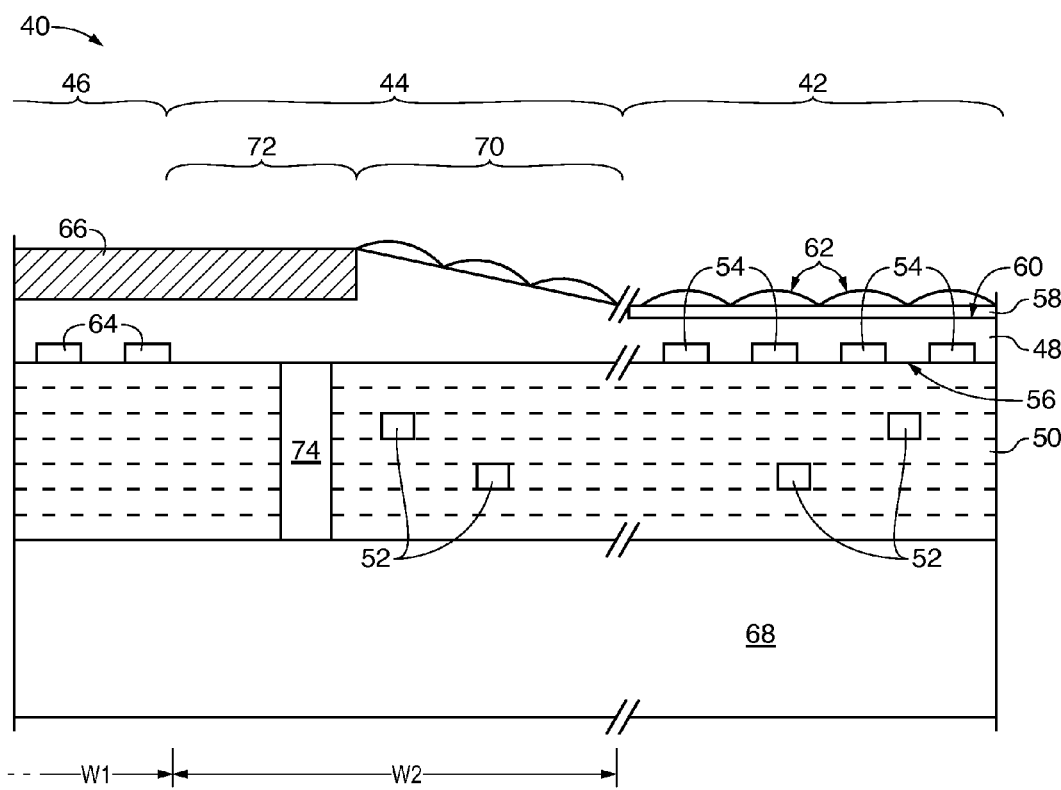
FIG. 3 is a cross-sectional side view of an illustrative backside illumination image sensor having an optical isolation region in a dielectric stack in accordance with an embodiment of the present invention.

A cross-sectional side view of an illustrative backside illumination (BSI) image sensor is shown in FIG. 3. Image sensor 40 in FIG. 3 may have a configuration as in FIG. 2A or FIG. 2B.

Image sensor 40 of FIG. 3 may have a substrate 48. Substrate 48 may be substrate such as silicon or p-type silicon. Substrate 48 may be an epitaxial layer. Substrate 48 may have a thickness in a range of about 1.5 microns to 3 microns. A dielectric stack 50 may be formed on front surface 56 of substrate 48. Dielectric stack 50 may have alternating metal and dielectric layers. Metal interconnects such as metal interconnects 52 may be formed in metal layers in dielectric stack 50. Metal interconnects may be formed from a suitable metal such as copper or aluminum. Dielectric layers may include metal vias. Dielectric layers may also be known as via layers. Dielectric stack may have, for example, two or more metal layers, four or more metal layers, six or more metal layers, or other suitable numbers of metal layers. Dielectric stack 50 may also be known as interlayer dielectric. Metal layer and via layers may be known as interconnect layers. A silicon carrier board 68 may be formed on dielectric stack 50.

Image sensor 40 includes an active pixel array such as active pixel array 42. Pixel array 42 includes pixels arranged in an array. Each pixel has a photodiode 54 formed in a front side 56 of silicon substrate 48. A color filter array 58 may be formed on back a surface 60 of substrate 48. A microlens array 62 may be formed over color filter array 58.

Light can enter from the back side of the image sensor pixels through microlenses in microlens array 62. Photons incident on photodiodes 54 in active pixel array 42 may be converted into charge that is output as pixel signals.

Optically black pixels 64 may be located in optically black pixel array 46. Optically black pixels 64 may be shielded from incoming light by shielding structure 66. Shielding structure 66 may be a black color filter array or metal-shielded color filter array.

Optically black pixels 64 may be separated from active pixel array 42 by buffer region 44. Buffer region 44 may have a sloped portion 70 that increases in height from active pixel array 42. An increase in height in sloped portion 70 may be useful for accommodating metal routings. Sloped portion 70 may have dummy microlenses 36 that are formed during the fabrication of microlens array 62 on active pixel array 42. Buffer region 44 may have a portion 72 into which shielding structure 66 extends and that is shielded by shielding structure 66.

Buffer region 44 may have a width W2 of about 10-50 pixels or of about 10-50 microns. Portion 72 of buffer zone may have a width of 10 or more pixels, 10-25 pixels, or about 10-50 microns.

A metal wall such as metal wall 74 may be provided in dielectric stack 50. Metal wall may serve to optically isolate optically black pixels 64 from stray light. Metal wall 74 may be formed across all metal and dielectric layers in dielectric stack 50. If desired, metal wall 74 may be formed across some metal and dielectric layers in dielectric stack 50. For example, metal wall 74 may be formed across four metal layers and intervening dielectric layers. If desired, metal wall 74 may be formed across two or more metal layers, two to four metal layers, three or more metal layers, more than four metal layers, or other suitable numbers of metal layers. Metal wall 74 may also be known as a barrier or optical isolation region. If image sensor 40 has a configuration of FIG. 2B, metal wall 74 may surround active pixel array 42 and be known as a metal wall ring.

Metal wall 74 may be formed from suitable metals such as copper or aluminum. Metal wall 74 may be formed from the same metals that form metal interconnects 52. If desired, metal wall 74 may be formed from different metals than metal interconnects 52.

Metal wall 74 may be formed in portion 72 of buffer region 44. Shielding structure 72 may extend over metal wall 74 such that shielding structure 74 covers metal wall 74.

Figure 4:
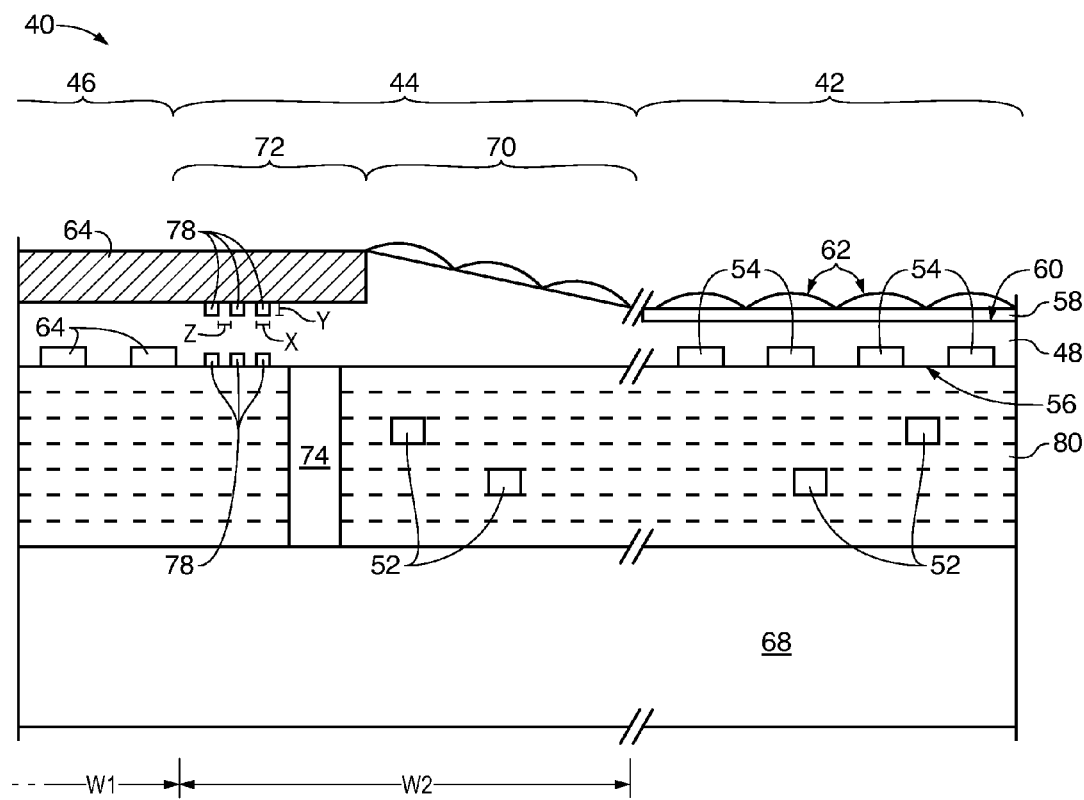
FIG. 4 is a cross-sectional side view of an illustrative backside illumination image sensor having an optical isolation region in a dielectric stack and isolation regions in a silicon substrate in accordance with an embodiment of the present invention.

FIG. 4 is a cross-sectional view of an image sensor 40 having a metal wall 74 and substrate isolation structures. Isolation structures 78 of FIG. 4 may be formed in substrate 48. Isolation structures 78 may be formed in portion 72 of buffer region 44 under shielding structure 78. Isolation structures 78 may be formed between metal wall 74 and optically black pixels 64. If desired, image sensor 40 may be formed with isolation structures 78 and without metal wall 74.

Isolation structures 78 may have large interfaces that provide high absorption of stray light. Isolation structures 78 may be patterned shallow trench isolation (STI) regions or patterned polysilicon regions. In the example of FIG. 4, isolation structures 78 are formed at front side 56 and back side 60 of substrate 48. If desired, isolation structures 78 may be formed only at front side 56 of substrate 48 or at back side 60 of substrate 48. Buffer region 44 may have multiple isolation structures 78 each having a depth Y of about 140 nm, 100-200 nm, or other suitable depths. Isolation structures 78 may have a width X in a direction between optically black pixel array 46 and active pixel array 42. Width X of isolation structures 78 may be in a range of about 50 to 200 nm, less than 200 nm, about 100 nm, or other suitable widths. Isolation structures 78 may be spaced apart by a distance Z in a direction between optically black pixel array 46 and active pixel array 42. Distance Z may be in a range of 50 to 200 nm, less than 200 nm, greater than 50 nm, or other suitable distances. Dimensions of isolation structures 78 and separation distances may be tuned to block specific wavelengths of light from reaching optically black pixel array 46.

Isolation structures 78 may span portion 72 of buffer region 44. In a direction between active pixel array 42 and optically black pixel array 46, image sensor 40 may have between 25 to 500 isolation structures, between 50 to 200 isolation structures, more than 25 isolation structures, more than 10 isolation structures, or other suitable numbers of isolation structures.

Figure 5:
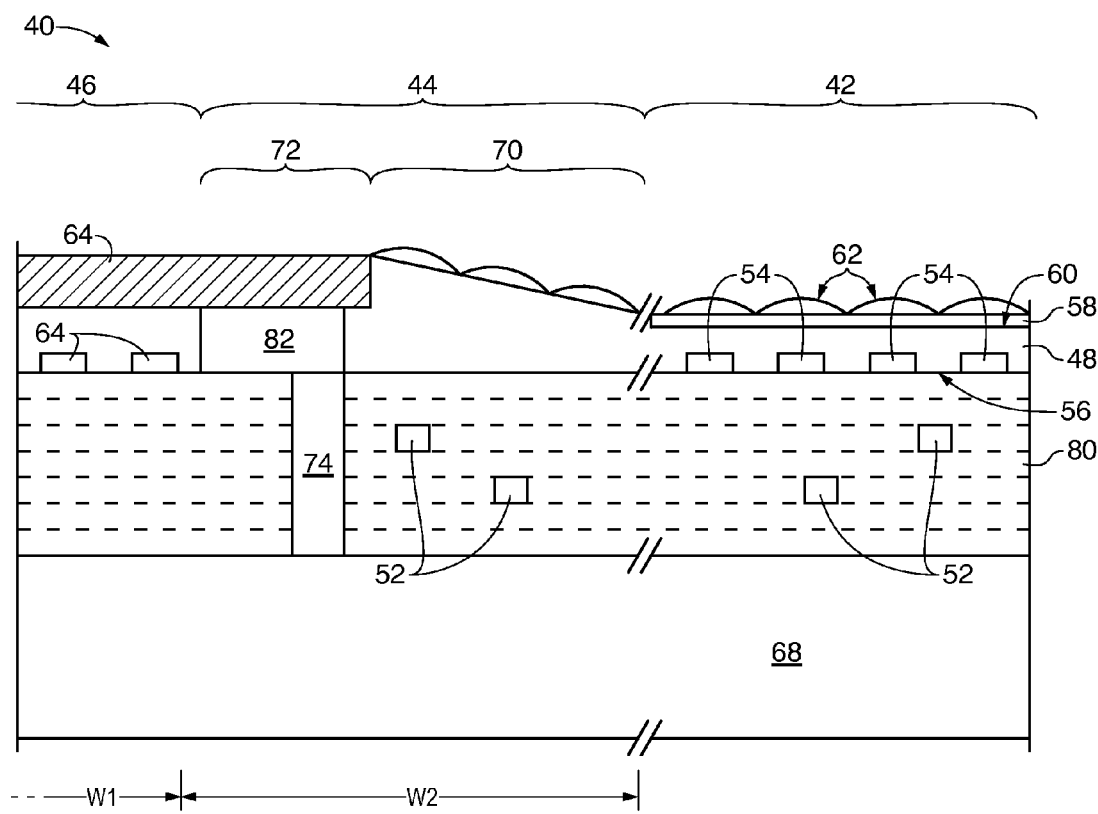
FIG. 5 is a cross-sectional side view of an illustrative backside illumination image sensor having an optical isolation region in a dielectric stack and a doped absorption region in a silicon substrate in accordance with an embodiment of the present invention.

FIG. 5 is a cross-sectional view of an image sensor 40 having a metal wall 74 and an isolation region 82 in substrate 48. Isolation region 82 may be formed in portion 72 of buffer region 44 under shielding structure 78. Isolation region 82 may be formed between metal wall 74 and optically black pixels 64. If desired, image sensor 40 may be formed with isolation region 82 and without metal wall 74. Isolation region 82 may have a higher index of refraction than the surrounding substrate so that stray light may be trapped inside isolation region 82. Isolation region 82 may absorb infrared light.

Isolation region 82 of FIG. 5 may be germanium-doped silicon. Isolation region 82 may have, e.g., 4% or more germanium, 5% or more germanium, about 4-5% germanium, or other suitable germanium doping amounts. Isolation region 82 may be formed by depositing germanium into substrate 48 from front side 56 and back side 60 of substrate 48. Isolation region 82 may have a germanium concentration profile that is greater at the surfaces 56 and 60 of substrate 38. If desired, germanium may be deposited only into front side 56 or only into back side 60 of substrate 48.

The presence of isolation region 74, 78, and 82 may enable width W2 of buffer region 44 (see, e.g., FIGS. 2-6) to be made smaller. Buffer region 44 may have a width W2 spanning, e.g., about 5 dead pixels, about 3 to 10 microns, less than 10 microns, less than 15 microns, or other suitable widths.

Figure 6:
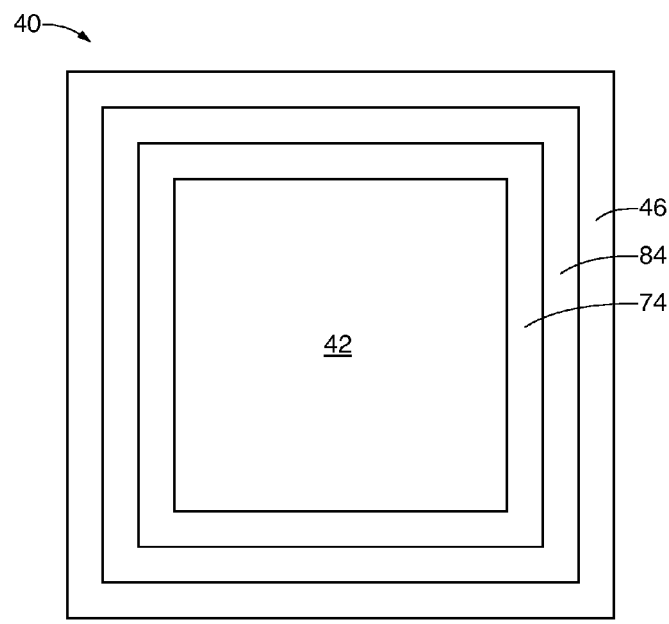
FIG. 6 is a top view of an illustrative backside illumination image sensor having optical isolation structures in accordance with an embodiment of the present invention.

FIG. 6 is a top view of image sensor 40. In the example of FIG. 6, optically black pixel array 46 may surround active pixel array 42. Metal wall 74 of FIGS. 3-5 may form an optical guard ring around active pixel array 42, between active pixel array 42 and optically black pixel array 46. Optical guard ring 84 may have germanium-doped isolation structure 82 of FIG. 5 or isolation structures 78 of FIG. 4. Optical guard ring 84 may surround active pixel array 42. Optical guard ring 84 may be located between active pixel array 42 and optically black pixel array 46. Optical guard ring 84 may be located between metal wall ring 74 and optically black pixel array 46.

Figure 7:
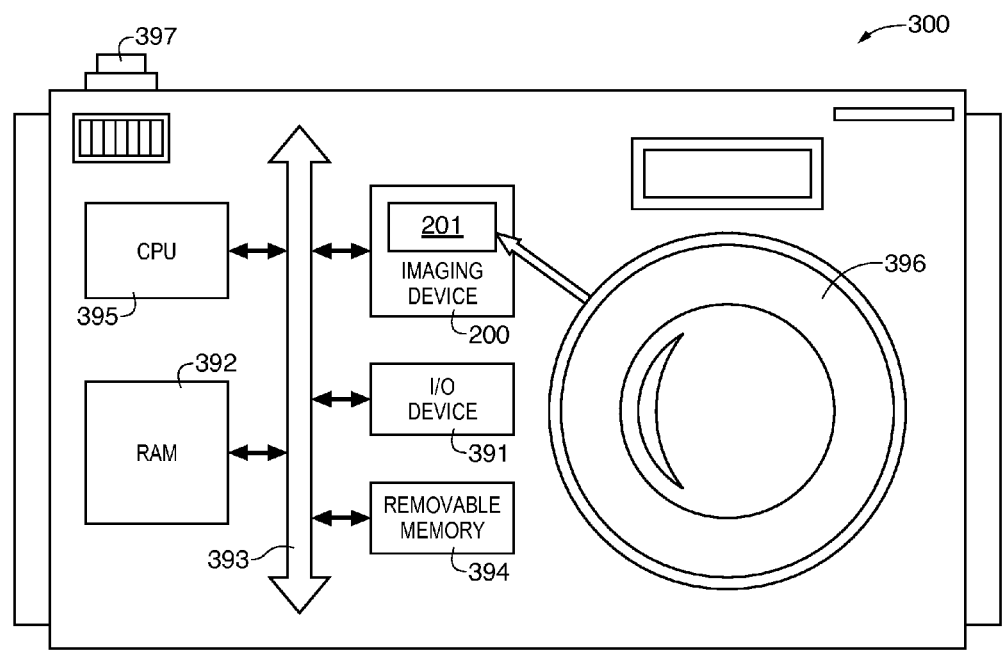
FIG. 7 is a block diagram of a processor system employing a backside illumination sensor of FIGS. 2-6 in accordance with an embodiment of the present invention.

FIG. 7 shows in simplified form a typical processor system 300, such as a digital camera, which includes an imaging device such as imaging device 200 employing an image sensor such as backside illuminated image sensor 40 of FIGS. 2-6. Processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Pixel array 201 may be a pixel array such as active pixel array 42 of FIG. 2-6. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating isolation for optically black pixels.

Optically black pixels may be provided for backside illumination (BSI) image sensors. Optically black pixels may be shielded from incoming light by black or metal-shielded color filter arrays. Optically black pixels may be located in an array adjacent to active pixel arrays. Optically black pixels may be located next to an active pixel array or may surround an active pixel array. A buffer region may separate optically black pixels from active pixels. A black or metal-shielded color filter array may cover at least a portion of a buffer region.

Optical isolation structures may be provided in a buffer region between optically black pixels and active pixels to prevent stray light from reaching optically black pixels. A metal wall may be formed in a dielectric stack in a buffer region. A metal wall may extend across multiple metal layers in a dielectric stack. A metal wall may be formed in a portion of a buffer region that is covered by a black or metal-shielded color filter array.

Optical isolation structures may be provided in a silicon substrate. Patterned shallow trench isolation (STI) or polysilicon may form optical isolation structures in a substrate. Multiple isolation structures may be formed that are spaced apart in order to increase interface area for the absorption of stray light.

An optical isolation structure may be provided by doping a silicon substrate in a buffer region with germanium. Germanium-doped silicon may provide high absorption of stray light.

Optical isolation structures may improve the optical isolation of optically black pixels. Optical isolation structures may enable a width of a buffer region between active pixels and optically black pixels to be decreased.

The foregoing is merely illustrative of the principles of this invention which can be practiced in other embodiments.

What is claimed is:

1. A backside illumination image sensor, comprising:
an active pixel region having a first plurality of pixels;
an optically black pixel region having a second plurality of pixels covered by an opaque layer;
a metal barrier between the active pixel region and the optically black pixel region, wherein the metal barrier extends vertically through a plurality of dielectric layers and metal interconnect layers.

2. The backside illumination image sensor of claim 1, further comprising at least one isolation structure in a silicon substrate between the active pixel region and the optically black pixel region.

3. The backside illumination image sensor of claim 2, wherein the at least one isolation structure comprises a plurality of isolation structures formed from shallow trench isolation.

4. The backside illumination image sensor of claim 2, wherein the at least one isolation structure comprises a plurality of isolation structures formed from polysilicon.

5. The backside illumination image sensor of claim 2, wherein the at least one isolation structure comprises a plurality of isolation structures at a front side of the silicon substrate adjacent to the plurality of dielectric layers and metal interconnect layers.

6. The backside illumination image sensor of claim 5, wherein the at least one isolation structure further comprises a plurality of isolation structures at a back side of the silicon substrate.

7. The backside illumination image sensor of claim 2, wherein the at least one isolation structure comprises a plurality of isolation structures each having a width of in a range of 50-200 nm and wherein the plurality of isolation regions are separated by a spacing in a range of 50-200 nm.

8. The backside illumination image sensor of claim 2, wherein the least one isolation structure comprises germanium-doped silicon.

9. A backside illumination image sensor, comprising:
an active pixel array;
an optically black pixel array;
a buffer region between the active pixel array and the optically black pixel array, wherein the buffer region comprises at least one optical isolation structure in a substrate and a metal wall that extends vertically through a plurality of dielectric layers and metal interconnect layers.

10. The backside illumination image sensor of claim 9, wherein the metal wall extends between the at least one optical isolation structure and the active pixel array.

11. The backside illumination image sensor of claim 10, wherein the metal barrier is formed across at least four metal interconnect layers.

12. The backside illumination image sensor of claim 11, wherein the at least one optical isolation structure comprises germanium-doped silicon.

13. The backside illumination image sensor of claim 11, wherein the at least one optical isolation structure comprises a plurality of shallow trench isolation structures.

14. The backside illumination image sensor of claim 11, wherein a shielding structure covers the optically black pixel array and the at least one optical isolation structure.

15. The backside illumination image sensor of claim 11, wherein the optical black pixel array surrounds the active pixel array and wherein the metal wall forms a guard ring around the active pixel array.

16. A system, comprising:
a central processing unit;
memory;
input-output circuitry; and
an imaging device, wherein the imaging device comprises:
an active pixel array in a substrate;
optically black pixels in the substrate;
a buffer region between the active pixel array and the optically black pixels, wherein the buffer region comprises a metal barrier, and the metal barrier extends vertically through a plurality of dielectric layers and metal interconnect layers.

17. The system defined in claim 16, wherein the buffer region further comprises a plurality of isolation regions in the substrate between the metal wall and the optically black pixels.

18. The system defined in claim 16, wherein the buffer region further comprises at least one optical isolation region formed of germanium-doped silicon.

19. The system defined in claim 18, wherein the germanium-doped silicon comprises four percent or more germanium.

20. The system defined in claim 16, wherein the imaging device comprises a backside illumination image sensor.

* * * * *